United States Patent [19]

Dupraz

[11] Patent Number: 5,053,915
[45] Date of Patent: Oct. 1, 1991

[54] CAPACITIVE SENSOR FOR A CIRCUIT FOR MEASURING THE POTENTIAL OF A LINE CONDUCTOR IN A METALCLAD STATION

[75] Inventor: Jean-Pierre Dupraz, Lyons, France
[73] Assignee: GEC Alsthom SA, Paris, France
[21] Appl. No.: 628,026
[22] Filed: Dec. 17, 1990
[30] Foreign Application Priority Data
Dec. 19, 1989 [FR] France ............................ 89 16815
[51] Int. Cl.$^5$ .......................... H01G 7/00; H01G 7/06
[52] U.S. Cl. .................................... 361/281; 361/283
[58] Field of Search ......................................... 361/281
[56] References Cited

U.S. PATENT DOCUMENTS

| | | | |
|---|---|---|---|
| 4,167,770 | 9/1979 | Graybill | 361/378 |
| 4,873,870 | 10/1989 | Delatorre | 29/25.41 |
| 4,947,131 | 8/1990 | Mayer et al. | 324/685 |
| 4,954,925 | 9/1990 | Bullis et al. | 361/283 |

FOREIGN PATENT DOCUMENTS 1942088 4/1971 Fed. Rep. of Germany.
2641574 3/1978 Fed. Rep. of Germany.
2827406 1/1980 Fed. Rep. of Germany.

Primary Examiner—Donald A. Griffin
Assistant Examiner—Le Nguyen
Attorney, Agent, or Firm—Sughrue, Mion, Zinn, Macpeak & Seas

[57] ABSTRACT

The present invention relates to a capacitive sensor comprising two concentric capacitors having a common electrode, namely a high tension capacitor and an auxiliary capacitor, the sensor including two screens separating the two electrodes of the high tension capacitor, and these two screens leaving a gap between each other of constant size. The invention is applicable to metalclad stations.

4 Claims, 2 Drawing Sheets

CAPACITIVE SENSOR FOR A CIRCUIT FOR MEASURING THE POTENTIAL OF A LINE CONDUCTOR IN A METALCLAD STATION

The present invention relates to a capacitive sensor for a circuit for measuring the potential of a line conductor, the sensor comprising two capacitors sharing a common electrode, said two capacitors comprising a high tension capacitor whose second electrode is constituted by the line conductor, and an auxiliary capacitor whose second electrode is connected to ground, with the common electrode receiving a connection cable connected to the measuring circuit.

BACKGROUND OF THE INVENTION

Such sensors are known in which the common electrode is a metal tube surrounding the line conductor, with the second electrode of the auxiliary capacitor being another tube of larger diameter which is separated from the first tube by a dielectric layer.

In such sensors, the capacitance of the high tension capacitor is not stable if ambient temperature varies. The length of the tube constituting the common electrode varies as a function of temperature, thereby disturbing the measurement of the potential of the line conductor beyond the acceptable margin of error which is about 0.2%.

The object of the present invention is to design a capacitive sensor in which the high tension capacitor has high stability. This object is achieved by adding two screens which leave a window between them of size which is constant regardless of temperature.

SUMMARY OF THE INVENTION

The present invention provides a capacitive sensor for a circuit for measuring the potential of a line conductor, the sensor comprising two capacitors having a common electrode, said two capacitors comprising a high tension capacitor whose second electrode is constituted by the line conductor and an auxiliary capacitor whose second electrode is connected to ground, with the common electrode receiving a connection cable connected to the measurement circuit, the electrodes of the high tension capacitor being separated by two screens which leave a window of constant size between them, wherein the window includes spacers of invar, thereby ensuring that said size remains constant.

In a preferred embodiment, the screens are made from a single cylinder of invar having windows of appropriate dimensions cut out therein.

BRIEF DESCRIPTION OF THE DRAWINGS

Embodiments of the invention are described by way of example with reference to the accompanying drawings, in which.

DETAILED DESCRIPTION

Figure 1:
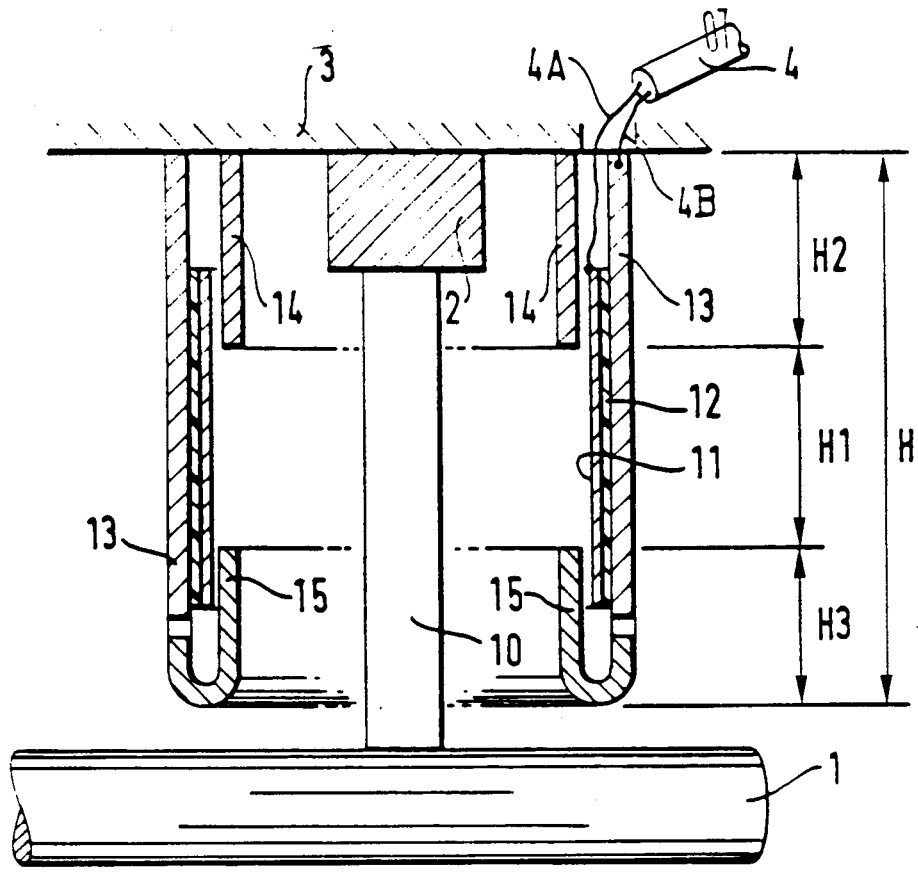
FIG. 1 shows a first embodiment of a capacitive sensor of the invention, the sensor being installed at the end of a conductor.

In FIG. 1 the capacitive sensor comprises two capacitors, a high tension first capacitor $C_1$ constituted between a line conductor 10 and an electrode 11, and a second capacitor $C_2$ constituted between the electrode 11 and an outer electrode 13. The common electrode 11 and the electrode 13 are separated by a dielectric layer 12.

The assembly constituted by the electrode 11 and the layer 12 is actually constituted by a metal-coated film glued onto the electrode 13. The electrode 11 constitutes the metal portion of the film, while the layer 12 constitutes the backing of the film, and its thickness is about 1 mm. The line conductor 10 (electrode 10) is connected at one end to a set of bars 1 in a high tension metalclad station, and at its other end it is connected to an insulator 2 mounted on a wall 3 of the metalclad station which is filled with a gas such as sulfur hexafluoride $SF_6$. The wall 3 and the electrode 13 are both at the same potential "0".

An electric cable 4 which provides the connection between the capacitive sensor and the measurement circuit installed outside the metalclad station is connected to the common electrode 11 by a wire 4A while its ground wire 4B is connected to the potential "0".

A sealed feedthrough (not shown) goes through the wall 3 allowing the cable 4 to pass therethrough.

A screen constituted by two cylindrical portions 14 and 15 is interposed between the conductor 10 and the common electrode 11. The portion 14 is connected to the wall 3 of the metal clad station while the portion 15 is connected to the electrode 13. Between these two portions, there is an empty space of height referenced $H_1$, with $H_2$ being the height of the portion 14, $H_3$ being the height of the portion 15, and H being the total height. More generally the "height" dimension is an axial extent, or merely a "size" dimension.

The capacitance of the capacitor $C_1$ is given by the following equation:

$$C_1 = 2\pi\epsilon_0\epsilon_r H_1/(l_n D/d)$$

where D is the inside diameter of electrode 11, d is the diameter of conductor 10, and $\epsilon_r$ is the relative permittivity of the $SF_6$ gas (a function of its density). If the conductor 10 and the electrode 11 are made of the same material, then their diameters will vary, but the ratio D/d will remain constant. For the capacitance of $C_1$ to remain constant, it is therefore necessary that $H_1$ remains constant regardless of temperature.

It is also necessary for $\epsilon_r$ to remain constant, however to satisfy this condition, a density meter may be used either to regulate the density and compensate for leakage, or else to provide for electronic correction of the drift in $\epsilon_r$. If electronic correction is performed, a density meter is used for measuring density, but it would also be possible to measure the pressure and the temperature of the gas.

For the height $H_1$, the following equation holds:

$$H_1 = H - H_2 - H_3$$

where:

$$H = H_0(1 + \alpha t)$$

$$H_2 = H_{20}(1 + \alpha_2 t)$$

$$H_3 = H_{30}(1 + \alpha_3 t)$$

where t is the ambient temperature, $\alpha$ is the coefficient of expansion for the conductor 10 and the electrodes 11 and 13; $\alpha_2$ is the coefficient of expansion of the portion 14 (height $H_2$) and $\alpha_3$ is the coefficient of expansion of the portion 15 (height $H_3$).

$$H_1 = H_0 - H_{20} - H_{30} + (H_0\alpha - H_{20}\alpha_2 - H_{30}\alpha_3)t$$

In order to ensure that $H_1$ is independent of temperature the heights $H_0$, $H_{20}$, and $H_{30}$ and the coefficients $\alpha$, $\alpha_2$, $\alpha_3$ should be chosen to satisfy the condition $$H_0\alpha - H_{20}\alpha_2 - H_{30}\alpha_3 = 0$$

In the simplest example, all of the portions 10, 11, 13, and 14 are made of the same material having a coefficient $\alpha$, and the portion 15 is made of a material having coefficient $\alpha_3$. In this case:

$$H_0\alpha - H_{20}\alpha - H_{30}\alpha_3 = 0$$

$$(H_0 - H_{30})\alpha - H_{30}\alpha_3 = 0$$

so $\alpha_3$ must be chosen such that $$\alpha_3 = \alpha(H_0 - H_{20})/H_{30}$$

Figure 2:
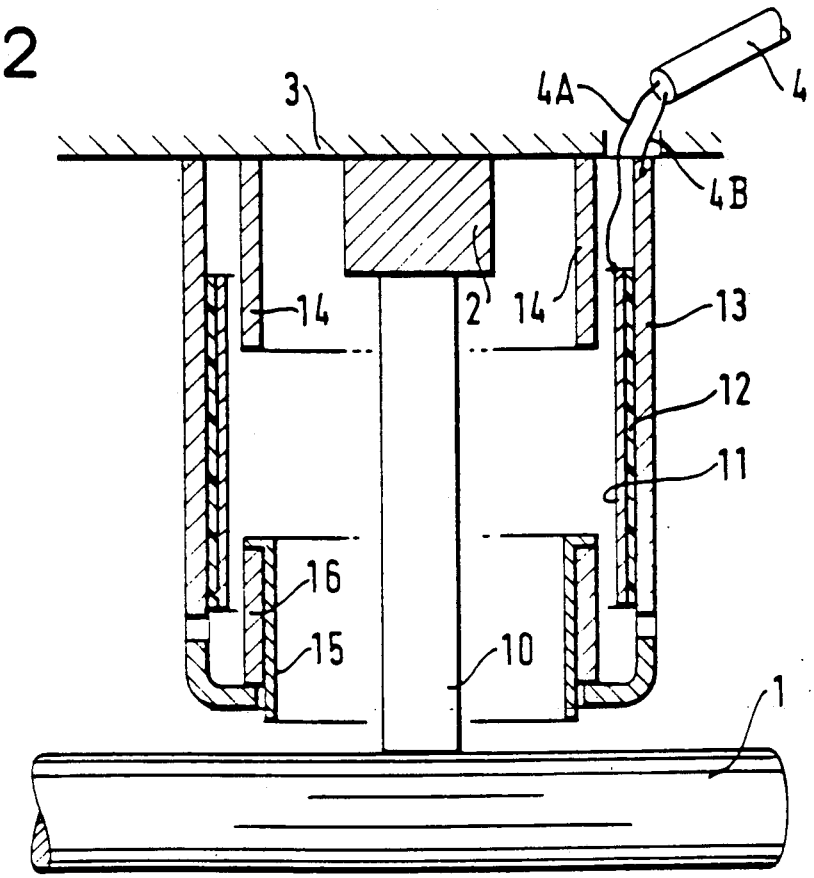
FIG. 2 shows a variant of this first embodiment.

FIG. 2 shows a variant embodiment in which the portion 15 is made of a material having coefficient $\alpha$ but is mounted on a support 16 made of a material having a coefficient of expansion $\alpha_3$.

Figure 3:
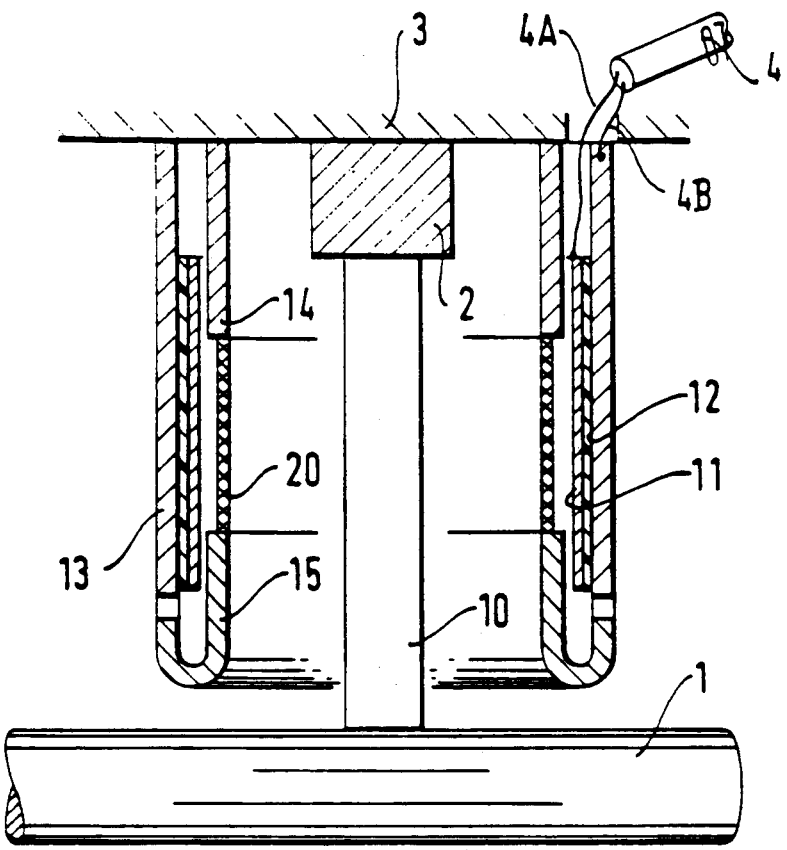
FIG. 3 shows a second embodiment of a capacitive sensor of the invention, the sensor likewise being installed at the end of a conductor.

In FIG. 3, the capacitive sensor has spacers 20 made of invar serving to keep the height of the window between the screens 14 and 15 constant. These spacers may be constituted by simple rods spaced around the circumference, or else they may constitute together with the two supports, a single cylinder which has openings around the window, in various different possible shapes, e.g. in the form of a grid.

Figure 4:
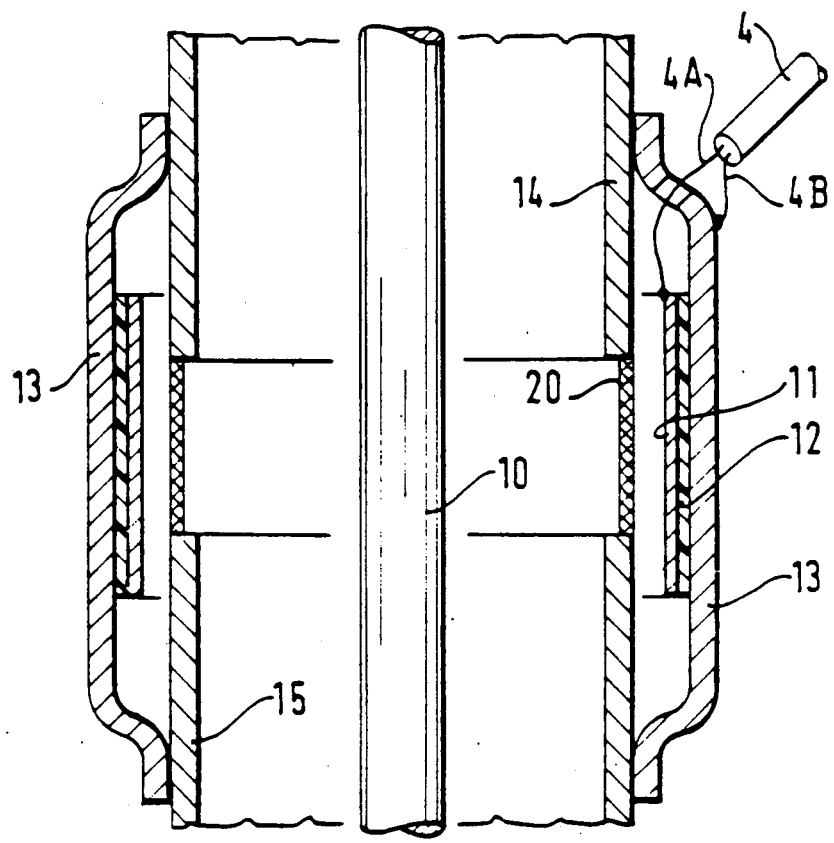
FIG. 4 shows a sensor in accordance with this second embodiment, said sensor being installed along a conductor.

In FIG. 4, the sensor is installed along a conductor, and the window between the conductor (or electrode) 10 and the electrode 11 includes spacers 20 made of invar for keeping the size of the window constant.

I claim:

1. A capacitive sensor for a circuit for measuring the potential of a line conductor, the sensor comprising two capacitors having a common electrode, said two capacitors comprising a high tension capacitor whose second electrode is constituted by the line conductor, and an auxiliary capacitor whose second electrode is connected to ground, with the common electrode receiving a connection cable connected to the measurement circuit, the electrodes of the high tension capacitor being separated by two screens which leave a window of constant size between them, wherein the window includes spacers of invar thereby ensuring that said size remains constant.

2. A capacitive sensor according to claim 1, wherein the screens are made from a single cylinder of invar having windows of appropriate dimensions cut out therein.

3. A sensor according to claim 1, immersed in a dielectric gas and wherein the relative permittivity of the gas is made constant by compensating for leaks.

4. A sensor according to claim 1, immersed in a dielectric gas, and wherein variations in capacitance due to variations in the relative permittivity of the gas are corrected electronically.

* * * * *